(12) United States Patent
Boo et al.

(10) Patent No.: US 12,148,736 B2
(45) Date of Patent: Nov. 19, 2024

(54) THREE-DIMENSIONAL BONDING SCHEME AND ASSOCIATED SYSTEMS AND METHODS

(71) Applicant: Micron Technology, Inc., Boise, ID (US)

(72) Inventors: Kelvin Tan Aik Boo, Singapore (SG); Hong Wan Ng, Singapore (SG); Seng Kim Ye, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/592,065

(22) Filed: Feb. 3, 2022

(65) Prior Publication Data

US 2023/0069476 A1    Mar. 2, 2023

Related U.S. Application Data

(60) Provisional application No. 63/238,098, filed on Aug. 27, 2021.

(51) Int. Cl.
*H01L 25/065* (2023.01)
*H01L 25/00* (2006.01)

(52) U.S. Cl.
CPC ......... *H01L 25/0657* (2013.01); *H01L 25/50* (2013.01); *H01L 2225/06506* (2013.01); *H01L 2225/06524* (2013.01); *H01L 2225/06562* (2013.01)

(58) Field of Classification Search
CPC ................ H01L 25/0657; H01L 25/50; H01L 2225/06506; H01L 2225/06524; H01L 2225/06562; H10B 80/00
See application file for complete search history.

(56) References Cited

U.S. PATENT DOCUMENTS

| | | | |
|---|---|---|---|
| 2009/0146283 A1* | 6/2009 | Chen ................... | H01L 25/0657 257/E25.01 |
| 2015/0054169 A1* | 2/2015 | Lee ........................ | H01L 24/49 257/773 |

* cited by examiner

*Primary Examiner* — Timor Karimy
(74) *Attorney, Agent, or Firm* — Perkins Coie LLP (57) ABSTRACT

Semiconductor devices having three-dimensional bonding schemes and associated systems and methods are disclosed herein. In some embodiments, the semiconductor device includes a package substrate, a stack of semiconductor dies carried by the package substrate, and an interconnect module carried by the package substrate adjacent the stack of semiconductor dies. The stack of semiconductor dies can include a first die carried by the package substrate and a second die carried by the first die. Meanwhile, the interconnect module can include at least a first tier and a second tier. The first tier can be carried by and electrically coupled to the package substrate, and the second tier can be carried by and electrically coupled to the first tier. In turn, the second die can be electrically coupled to the second tier.

20 Claims, 10 Drawing Sheets

THREE-DIMENSIONAL BONDING SCHEME AND ASSOCIATED SYSTEMS AND METHODS

CROSS-REFERENCE TO RELATED APPLICATION(S)

The present application claims priority to U.S. Provisional Patent Application No. 63/238,098, filed Aug. 27, 2021, the disclosure of which is incorporated herein by reference in its entirety.

TECHNICAL FIELD

The present disclosure is generally related to systems and methods for stacked semiconductor devices. In particular, the present technology relates to stacked semiconductor devices having vertical interconnect modules for coupling dies in stacked semiconductor devices.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, interconnecting circuitry, etc. Semiconductor die manufacturers are under continuous pressure to reduce the volume occupied by semiconductor devices while increasing the capacity and/or speed of the resulting semiconductor assemblies. To meet these demands, semiconductor die manufacturers often stack multiple semiconductor dies vertically on top of each other to increase the capacity and/or the performance of semiconductor devices within the limited area on a circuit board or other element to which the semiconductor devices and/or assemblies are mounted. The stacked dies are then electrically coupled to the circuit board and can send and receive signals individually or in conjunction. However, as the height of die stacks increase to meet demands the increasing height presents continual challenges to the electrical connection of the dies.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Overview

Semiconductor devices having three-dimensional bonding schemes adapted for die stacks, and associated systems and methods, are disclosed herein. One option for electrically connecting stacked semiconductor dies is to laterally offset the dies (e.g., stagger the die stack), and interconnect the dies through a series of wire bonds. Various dies in the stack can then be connected to a package substrate through relatively long wire bonds. However, as the number of dies in a single die stack increase along with demands on performance, so do the number of wire bonds required to electrically couple the dies to the package substrate. One result of the increasing number of wire bonds is the formation of electrical shorts between the wire bonds packed into a given area (commonly referred to as "wire sweep"). To provide room for the additional wire bonds, die stacks can include one or more sub-stacks of dies that are offset in varying directions. While a first sub-stack of dies can then be electrically coupled to the package support substrate on a first side, another sub-stack of dies can then be electrically coupled to the package support substrate on a second side. However, the relatively long wire bonds from the upper sub-stacks can still encounter wire sweep issues. Further, industry demands to shrink the longitudinal footprints of semiconductor packages can require more wire bonds be packed into a single area, which can exacerbate existing wire sweep issues.

Other issues can also arise from the relatively long wire bonds, such as a trade-off between cost and performance due to the long travel distance for signals to dies in the upper portions of a die stack imposed by the series of wire bonds. For example, the long travel distance can lead to signal delay and/or desynchronization between upper dies and lower dies. One method for addressing this concern is to use costly materials, such as gold, to form the wire bonds with minimal resistance. However, these materials cannot completely alleviate the signal delay/desynchronization concerns, and the cost of using these materials in a semiconductor device can be prohibitive for larger die stacks. Further, the increasing number of wire bonds packed into a small area can encounter problems with crosstalk between different signal lines.

Semiconductor devices with features that address these concerns, and related systems and methods, are disclosed herein. One example of such a semiconductor device (sometimes also referred to as a "semiconductor die assembly" and/or a "semiconductor package") includes a package substrate (sometimes also referred to as "a package support substrate," a "substrate," a circuit board," or a "carrier"), a stack of semiconductor dies (sometimes also referred to as a "die stack" or a "stack of dies") carried by the package substrate, and an interconnect module (sometimes also referred to as a "three-dimensional interconnect module" or a "vertical interconnect module") carried by the package substrate adjacent the stack of dies. The stack of dies can include at least one first die carried by the package substrate and at least one second die carried by the first die(s). The interconnect module can include at least a first tier and a second tier. The first tier can be carried by and electrically coupled to the package substrate while the second tier can be carried by and electrically coupled to the first tier. In turn, the second die(s) can be electrically coupled to the second tier, for example through one or more wire bonds with a bond pad carried by the second tier. The wire bonds connecting the second die(s) to the second tier can be shorter than wire bonds to connect the second die(s) to the package substrate. Accordingly, the interconnect module can reduce concerns with wire sweep associated with long bond lines. Further, the interconnect module can shorten the overall signal travel distance and/or insulate signal lines from each other, thereby reducing concerns with signal delay, desynchronization, and/or crosstalk.

In some embodiments, the package substrate includes a redistribution layer (e.g., at an upper surface of the package substrate) and one or more components of the semiconductor device (e.g., the stack of dies and/or the interconnect module) are carried by the surface of the package substrate at least partially over the redistribution layer. The redistribution layer can electrically couple the components of the semiconductor device to package connections (e.g., bond pads, solder balls, and the like) on a second surface (e.g., a lower surface) of the package substrate, allowing for interconnection of the semiconductor device with external components.

In some embodiments, the first tier is electrically coupled directly to the package substrate through one or more first wire bonds, while the second die(s) are electrically coupled to the second end of the second tier through one or more second wire bonds. In various embodiments, the first die(s) are electrically coupled to the package substrate and/or the first tier through one or more wire bonds. For example, a first set of bond pads on the first tier can be wire bonded to the first die(s) while a first set of bond pads on the first tier can be wire bonded to the package substrate.

In various embodiments, first and second tiers can have various ratio correspondences between the bond pads on the second tier and the bond pads on the first tier (e.g., a 1:1 (second tier to first tier) ratio, a 2:1 ratio, a 1:2 ratio, and/or any other suitable ratio). For example, in some embodiments, each of the bond pads on the second tier is electrically connected to a corresponding individual bond pad on the first tier. In another example, in some embodiments, each bond pad in the first tier is electrically connected to two bond pads in the second tier.

In some embodiments, the stack of dies in the semiconductor device further includes one or more third dies carried by the second die(s) that are electrically connected to the package substrate through the interconnect module. In some embodiments, for example, the interconnect module has a third tier carried by and electrically coupled to the second tier as well as the third die(s). The third tier can also include one or more bond pads with varying correspondences to bond pads on the first tier. For example, the second and third tiers can each include a predetermined number of bond pads, while the first tier includes double the predetermined number of bond pads, allowing each of the bond pads on the second and third tiers to be electrically connected to an individual bond pad on the first tier. In another example, one or more bond pads on the first tier can be coupled to bond pads in both the second and third tiers.

In some embodiments, the semiconductor device includes multiple interconnect modules positioned on one or more longitudinal sides of the stack of dies. The additional interconnect modules can have varying heights, for example allowing additional dies to be included in the stack of dies and connected to an interconnect module. Alternatively, the additional interconnect modules can be generally similar in construction, allowing the interconnect modules to be more easily produced in bulk while still alleviated the wire sweep, signal delay, and crosstalk concerns discussed above.

For ease of reference, the semiconductor device and its components are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the semiconductor device and its components can be moved to, and used in, different spatial orientations without changing the structure and/or function of the disclosed embodiments of the present technology.

Further, although primarily discussed herein as in the context of large die stacks, one of skill in the art will understand that the scope of the invention is not so limited. For example, the three-dimensional interconnect module can also be used in various other aspects of a semiconductor device and/or for any sized stack of semiconductor dies (including a stack of only a single die carried by a package substrate). Accordingly, the scope of the invention is not confined to any subset of embodiments, and is confined only by the limitations set out in the appended claims.

Description of the Figures

Figure 1A:
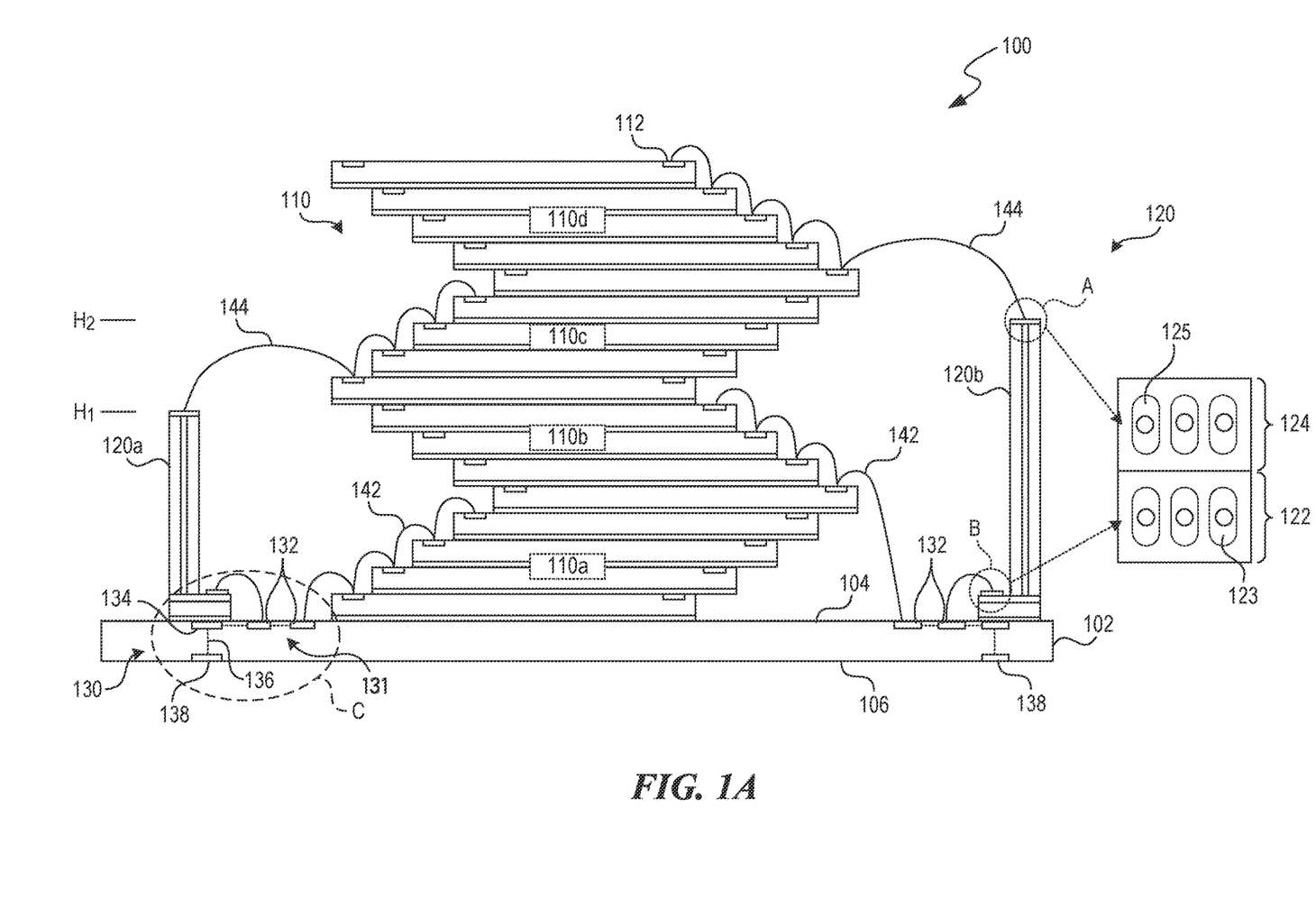
FIG. 1A is a partially cross-sectional view of a semiconductor device that includes interconnect modules in accordance with some embodiments of the present technology.

FIG. 1A is a partially cross-sectional view of a semiconductor device 100 configured in accordance with some embodiments of the present technology. In the illustrated embodiment, the semiconductor device 100 ("device 100") includes a package substrate 102 that has a first surface 104 (e.g., an upper surface, a stacking surface, etc.) and a second surface 106 (e.g., a lower surface, package connection surface, etc.) opposite the first surface 104. The device 100 also includes a stack of semiconductor dies 110 (also referred to as the "die stack 110") stacked on the first surface 104 of the package substrate 102. The die stack 110 includes first-fourth sub-stacks 110a-110d, each of which includes one or more dies (four shown for each of the first-third die sub-stacks 110a-110c, five shown for the fourth sub-stack 110d) that are staggered (e.g., offset in a longitudinal direction) in varying directions. For example, in the illustrated embodiment, the dies in the first sub-stack 110a are staggered in a first direction, while the dies in the second sub-stack 110b are staggered in a second direction opposite the first direction.

In some embodiments, each of the dies in the die stack 110 can be a memory die, a logic die, a controller die, or any other kind of die. Further, in some embodiments, the die stack 110 can include any combination of die types therein. Purely by way of example, each of the dies in the first sub-stack 110a can be logic dies while each of the dies in the second sub-stack 110b can be memory dies. Additionally, in some embodiments, the die stack 110 can be carried by a controller die (e.g., as discussed in more detail below) between the die stack 110 and the substrate 102 and independently connected to the substrate 102 and/or any of the dies in the die stack 110.

As further illustrated in FIG. 1A, the device 100 also includes one or more (two shown) three-dimensional interconnect modules 120 (sometimes also referred to as a "vertical interconnect module" or "the interconnect module") carried by the first surface 104 of the package substrate 102. As discussed in more detail below, each of the interconnect modules 120 (referred to individually as first and second interconnect modules 120a, 120b) can have a different height and/or overall bonding scheme. In the illustrated embodiment, each of the interconnect modules 120 includes a first tier 122 (also referred to herein as "the lower tier 122") carried by and electrically connected to the package substrate 102 and a second tier 124 (also referred to herein as "the upper tier 124") carried by and electrically connected to the first tier 122. However, the first interconnect module 120a has a first height $H_1$ while the second interconnect module has a second height $H_2$ greater than the first height $H_1$.

The substrate 102 can also include an internal redistribution system 130 that provides and electrically connects electrical contacts on the first surface 104 to one or more second contacts on the second surface 106. In the illustrated embodiment, the internal redistribution system 130 includes a redistribution layer 131 on the first surface 104 of the package substrate 102 and one or more through substrate connections 136 (e.g., through substrate vias (TSVs) and/or any other suitable connection). The redistribution layer 131 can include one or more first bond pads 132 and one or more second bond pads 134 each positioned at the first surface 104. The first bond pads 132 are electrically couplable to the die stack 110 and/or the interconnect modules 120 (e.g., through wire bonds), while the second bond pads 134 are electrically coupled to the first bond pads 132 through the redistribution layer 131.

Figure 1B:
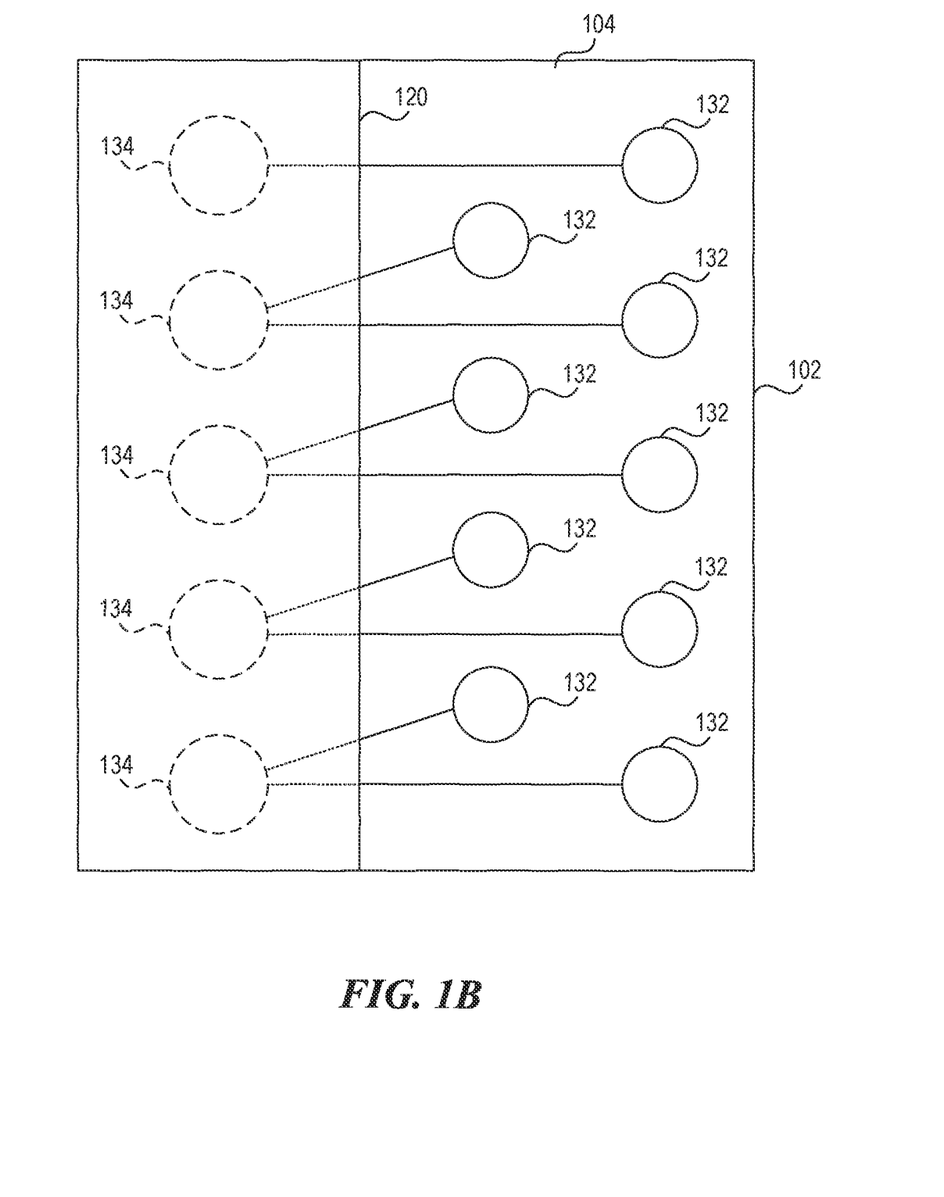
FIG. 1B is a top view of a portion of the semiconductor device of FIG. 1A in accordance with some embodiments of the present technology.

For example, as illustrated in FIG. 1B, corresponding to a top view of a first region A in FIG. 1A, the redistribution layer electrically connects each of the first bond pads 132 to at least one of the second bond pads 134. In the illustrated embodiment, the ratio between the first bond pads 132 and the second bond pads 134 is 2:1. However, in other embodiments, the ratio can vary as appropriate for the number of independent signal lines. For example, in various embodiments, the ratio can be 0.5:1, 1:1, 1.5:1, 3:1, and/or any other suitable ratio. As further illustrated in FIGS. 1A and 1B, the second bond pads 134 can be positioned at least partially underneath the interconnect modules. Additionally, or alternatively, in some embodiments, the second bond pads 134 can be positioned at least partially underneath the die stack 110.

The positioning of the second bond pads 134 at least partially underneath components of the device 100 allows the longitudinal footprint of the device 100 to be reduced. For example, by positioning the second bond pads in the same longitudinal space, albeit at a different vertical elevation, as electrical connections to the die stack (e.g., the first and second tiers 122, 124), the device 100 does not need additional dedicated longitudinal space for the second bond pads 134 to interconnect the first surface 104 with the second surface 106.

The internal redistribution system 130 also includes substrate connections 136 (e.g., TSVs) that are electrically coupled to the second bond pads 134 at the first surface 104. Further, the substrate connections 136 extend from the first surface 104 to the second surface 106 and are electrically coupled to one or more third bond pads 138 carried by the second surface 106. The third bond pads 138 are electrically couplable to an external semiconductor device or component (e.g., another device 100, a carrier circuit board, and the like).

As further illustrated in FIG. 1A, each of the dies in each of the first-fourth sub-stacks 110a-110d can be electrically connected through a series of first wire bonds 142. In turn, at least one of the dies in each of the first-fourth sub-stacks 110a-110d can be electrically connected to the package substrate 102 through second wire bonds 144 and/or the interconnect module. For example, in the illustrated embodiment, the lowermost die of each of the first and second sub-stacks 110a, 110b is directly electrically connected to the first bond pads 132 on the package substrate 102 through the second wire bonds 144. Meanwhile, in the illustrated embodiment, the lowermost die on each of the third and fourth sub-stacks 110c, 110d is electrically connected to the second tiers 124 of the first and second interconnect modules 120a, 120b through the second wire bonds 144. The second tier 124 is internally electrically connected to the first tier 122, which is then connected to the first bond pads 132 on the package substrate 102 through the second wire bonds 144.

FIG. 1A also illustrates a top view of the interconnect module 120, with a second region B corresponding to a top view of the first tier 122 and a third region C corresponding to a top view of the second tier 124. In the illustrated embodiment, each of the first and second tiers 122, 124 includes a plurality of lower and upper bond pads 123, 125 (respectively). The lower bond pads 123 are electrically coupled to the first bond pads 132 on the package substrate through the second wire bonds 144 while, as discussed in more detail below, each of the upper bond pads 125 is electrically coupled to at least one of the lower bond pads 123 through internal connections (e.g., internal TSVs). The upper bond pads 125 on the second tier 124 are also electrically coupled to the die stack 110 through the second wire bonds 144.

In the illustrated embodiment, the upper bond pads 125 have a 1:1 ratio with the lower bond pads 123, with each upper bond pad 125 electrically coupled to a corresponding lower bond pad 123. In various embodiments, the ratio between the upper and lower bond pads 125, 123 can vary as appropriate for signal lines, the number of sub-stacks coupled to the upper bond pads, the number of sub-stacks coupled to the lower bond pads 123, and the like. Similarly, in the illustrated embodiment, each of the lower and upper bond pads 123, 125 has only a single second wire bond 144 formed thereon. In various embodiments include any other suitable number of wire bonds.

Figure 2:
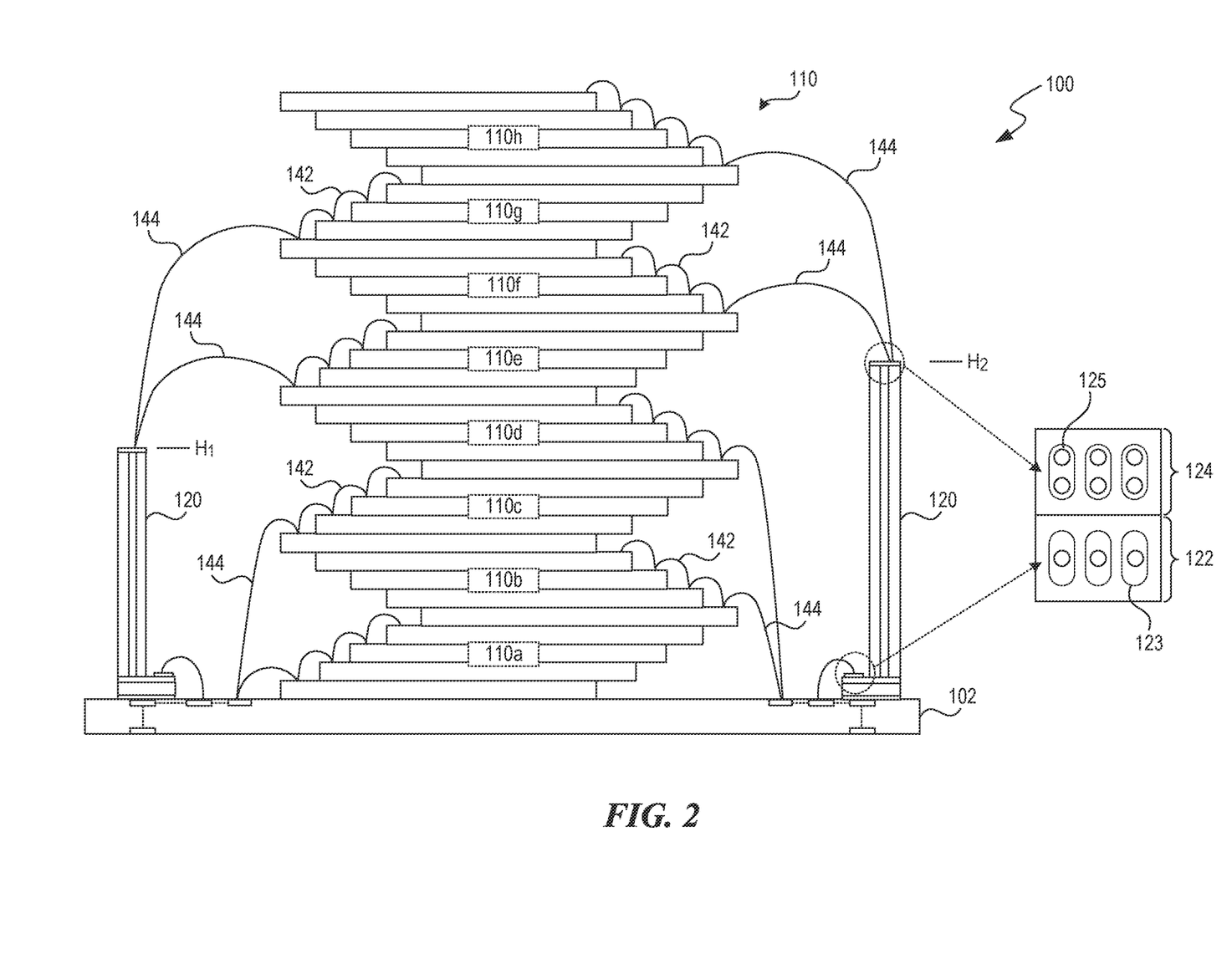
FIG. 2 is a partially cross-sectional view of a semiconductor device of FIG. 1A in accordance with further embodiments of the present technology.
Figure 3:
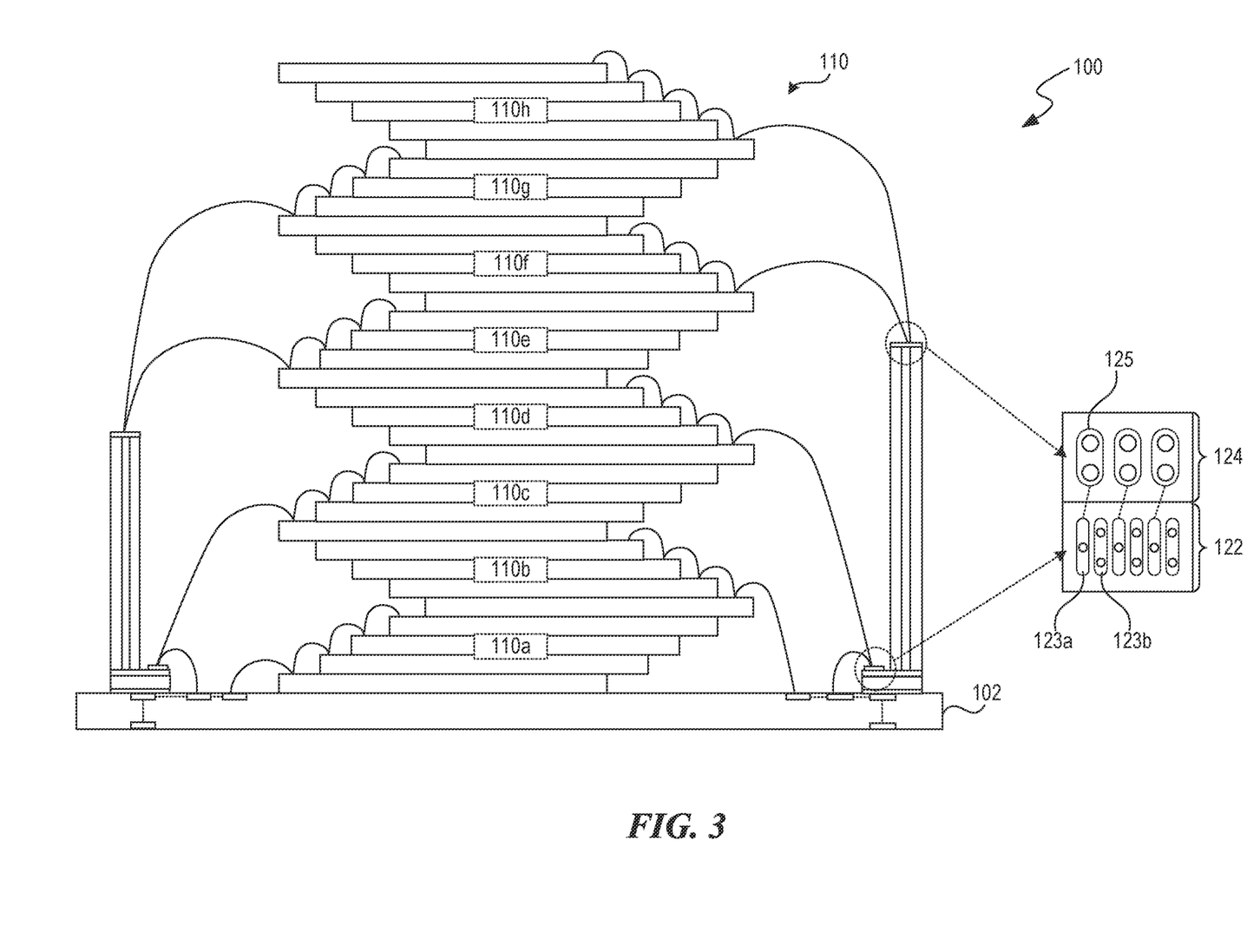
FIG. 3 is a partially cross-sectional view of a semiconductor device that includes interconnect modules with additional electrical connections in accordance with some embodiments of the present technology.

For example, FIGS. 2 and 3 are partially cross-sectional views of a semiconductor device 100 in accordance with further embodiments of the present technology. Referring to FIGS. 2 and 3 together, the illustrated embodiments are generally similar to the device 100 discussed above with respect to FIGS. 1A and 1B. For example, the device 100 includes the package substrate 102, the die stack 110 carried by and electrically coupled to the package substrate 102, and the interconnect modules 120 carried by and electrically coupled to the package substrate 102. However, as illustrated in FIGS. 2 and 3, the die stack 110 includes additional sub-stacks (e.g., fifth-eighth sub-stacks 110e-110h) carried by the first-fourth sub-stacks 110a-110d. Further, the interconnect modules 120 are configured in accordance with further embodiments of the present technology.

For example, as illustrated with respect to FIG. 2, the first-fourth sub-stacks 110a-110d are electrically coupled to the first bond pads 132 on the substrate through the second wire bonds 144, while the fifth-eighth sub-stacks 110e-110h are electrically coupled to the first bond pads 132 on the substrate through the interconnect modules 120. Further, in the illustrated embodiment, each of the upper bond pads 125 on the second tier 124 of the interconnect modules 110 have two second wire bonds 144 formed thereon. For example, each of the sixth and eighth sub-stacks 110f, 110h are electrically coupled to the same upper bond pads 125 on the first interconnect module 110a (e.g., with two second wire bonds 144 connecting to the same upper bond pad 125). In other embodiments, each of the upper bond pads 125 includes only a single second wire bond 144 formed thereon. For example, the second tier 124 can include additional upper bond pads 125 and/or the sixth and eighth sub-stacks 110f, 110h can be connected by fewer second wire bonds 144.

Further, in the embodiment illustrated in FIG. 2, the first and second interconnect modules 120a, 120b have third and fourth heights $H_3$, $H_4$, respectively, that are taller than the first and second interconnect modules 120a, 120b illustrated in FIG. 1A. Said another way, the first interconnect module 120a carries the upper bond pads 125 at an elevation above the package substrate 102 corresponding to the third height $H_3$, while second interconnect module 120b carries the upper bond pads 125 at an elevation above the package substrate 102 corresponding to the fourth height $H_4$. The elevation of the upper bond pads 125 in FIG. 2 is above the elevation of the upper bond pads 125 in FIG. 1. The higher elevation of the upper bond pads 125 in FIG. 2 can help shorten the length of the second wire bonds 144 connecting the fifth-eighth sub-stacks 110e-110h to the interconnect modules 120, thereby mitigating (e.g., preventing or reducing) concerns about wire sweep, signal delay and desynchronization, and/or crosstalk from longer travel paths.

As illustrated with respect to FIG. 3, the ratio between the lower bond pads 123 and the upper bond pads 125 in the interconnect modules 120 can deviate from 1:1. For example, in the illustrated embodiment, the interconnect modules 120 include two lower bond pads 123 for each of the upper bond pads 125 (e.g., corresponding to a 2:1 ratio). In various embodiments, the ratio between the lower and upper bond pads 123, 125 can be 0.5:1, 1:1, 1.5:1, 2:1, 3:1, and/or any other suitable ratio.

In the illustrated embodiment, the additional lower bond pads 123 allow at least a portion of the lower bond pads 123 to be electrically coupled to one or more sub-stacks in the die stack 110 independently from the connection between the upper bond pads 125 and one or more other sub-stacks in the die stack 110. For example, a first lower bond pad 123a is electrically coupled to an upper bond pad 125 that is, in turn, connected to the sixth and eighth sub-stacks 110f, 110h; while a second lower bond pad 123b is electrically coupled to the fourth sub-stack 110d. Accordingly, the sixth and eighth sub-stacks 110f, 110h can be electrically coupled to the package substrate 102 through the first lower bond pad 123a, while the fourth sub-stack 110d is electrically coupled to the package substrate 102 through the second lower bond pad 123b.

Figure 4A:
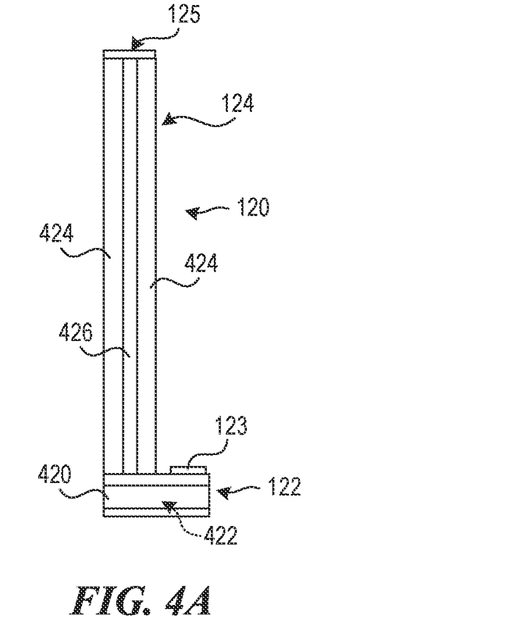
FIGS. 4A-4C are cross-sectional views of interconnect modules in accordance with various embodiments of the present technology.
Figure 4B:
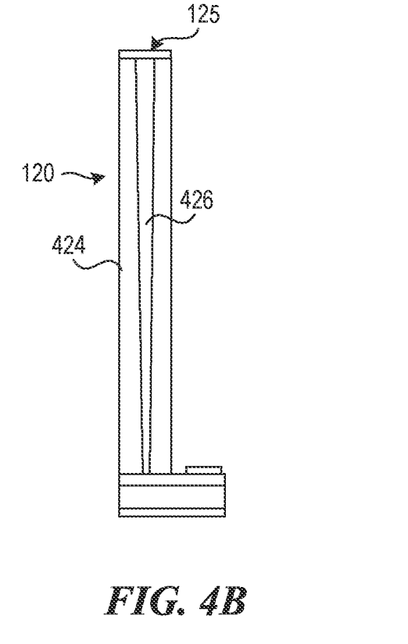
Figure 4C:
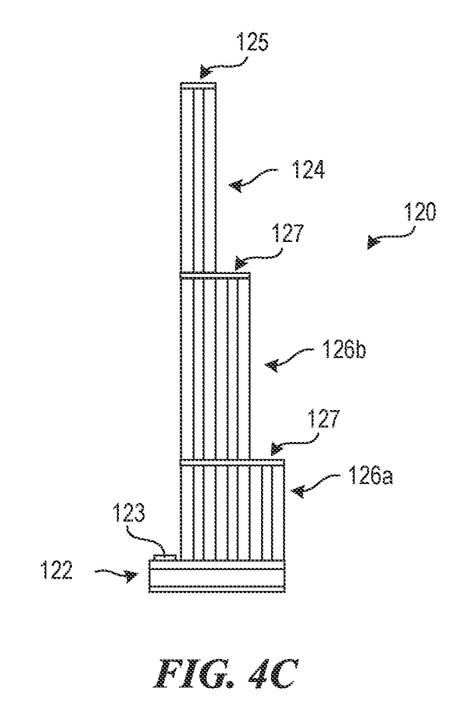

FIGS. 4A-4C are cross-sectional views of interconnect modules in accordance with various embodiments of the present technology. In the embodiment illustrated in FIG. 4A, the interconnect module 120 includes a first tier 122 and a second tier 124. The first tier 122 includes a first base material 420 with one or more electrical channels 422 formed therein, while the second tier 124 includes a second base material 424 with one or more electrical channels 426 formed therein (e.g., as shown in cross-section). A first end of the electrical channels 426 is electrically coupled to the upper bond pads 125, while a second end is electrically coupled to the electrical channels 422 of the first tier 122. In turn, while a first end of the electrical channels 422 is electrically coupled to the electrical channels 426 of the second tier 124, a second end is electrically coupled to the lower bond pads 123. Accordingly, the electrical channels 422, 426 electrically coupled the lower bond pads 123 to the upper bond pads 125 through the first and second base materials 420, 424 of the first and second tiers 122, 124.

In various embodiments, the first base material 420 can include an organic or inorganic laminate and/or a partially cured epoxy or resin (e.g., a prepreg). In some embodiments, the first base material 420 at least partially insulates the electrical channels 422 from each other, thereby reducing signal crosstalk between the electrical channels 422. In various embodiments, the electrical channels 422 can then be formed within vias in the first base material 420 and/or on a surface of the first base material 420. In various embodiments, for example, the electrical channels 422 can include a layer of copper, gold, nickel, and/or any other suitable material deposited in and/or on the first base material 420. With this structure, the first tier 122 can be manufactured in bulk. For example, the first base material 420 can be formed in a large sheet or wafer that is then diced to form single tiers and drilled to form vias for the electrical channels 422.

Similar to the first base material 420, in various embodiments, the second base material 424 can include an organic or inorganic laminate and/or a partially cured epoxy or resin (e.g., a prepreg). In some embodiments, the second base material 424 at least partially insulates the electrical channels 426 from each other, thereby reducing signal crosstalk between the electrical channels 426. Further, in various embodiments, the electrical channels 426 can then be formed within vias in the second base material 424 (as illustrated) and/or on a surface of the second base material 424 (not shown). In various embodiments, the electrical channels 426 can include a layer of copper, gold, nickel, and/or any other suitable conductive material deposited in and/or on the second base material 424. Like the first tier 122, the second tier 124 can be manufactured in bulk. For example, the second base material 424 can be formed in a large sheet or wafer that is then diced to form single tiers and drilled to form vias for the electrical channels 426.

In some embodiments, the first and second base materials 420, 424 are the same material. In some such embodiments, the first and second tiers 122, 124 can be manufactured in bulk together. For example, the first and second base materials 420, 424 can be formed in a large sheet that is then drilled to form vias; a conductive material (e.g., any of the materials discussed above) can then be deposited in the vias; and the sheet can be diced according to desired sizes for each of the first and second tiers 122, 124.

FIG. 4B is a partially cross-sectional view of the interconnect module 120 in accordance with some embodiments of the present technology. In the illustrated embodiment, the electrical channel 426 is manufactured by drilling (e.g., mechanically, with a laser, or any other suitable mechanism) into the second base material 424 to form a via, then depositing a conductive material. As a result of the drilling process, however, the via (and therefore the electrical channel 426) can have a tapered shape. For example, in the illustrated embodiment, the first end of the electrical channels 426 coupled to the upper bond pads 125 has a wider diameter than the second end of the electrical channels 426.

FIG. 4C is a partially cross-sectional view of the interconnect module 120 in accordance with further embodiments of the present technology. In the illustrated embodiment, the interconnect module includes two intermediate tiers 126 (referred to individually as first and second intermediate tiers 126a, 126b) in addition to the lower and upper tiers 122, 124. The first intermediate tier 126a can be carried directly by and electrically coupled to the lower tier 122; the second intermediate tier 126b can be carried by and electrically coupled to the first intermediate tier 126a; and the upper tier can be carried by and electrically coupled to the second intermediate tier 126b. Further, each of the intermediate tiers 126 can carry one or more intermediate bond pads 127 at an elevation above the lower bond pads 123. The intermediate bond pads 127 are coupled to the lower bond pads 123 through the intermediate tiers 126. Further, the upper bond pads 125 are electrically coupled to the lower bond pads 123 through the intermediate tiers 126 (e.g., the upper tier 124 can be electrically coupled to a portion of the intermediate bond pads 127). As discussed in more detail below, the intermediate bond pads 127 allow additional sub-stacks to be electrically coupled to the interconnect module 120 at heights that reduce and/or minimize the length of corresponding wire bonds.

Figure 5:
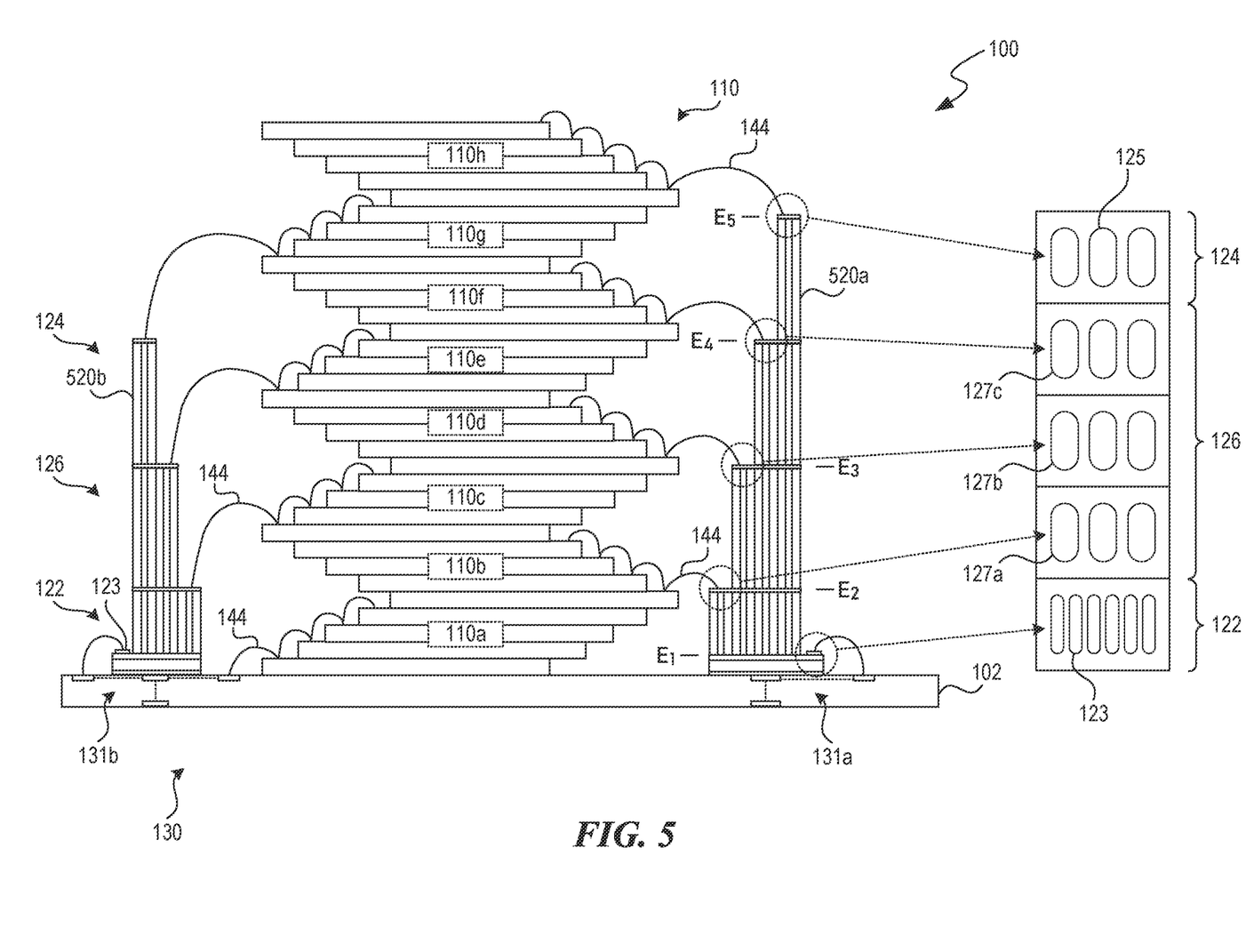
FIG. 5 is a partially cross-sectional view of a semiconductor device that includes similar interconnect modules in accordance with some embodiments of the present technology.

FIG. 5 is a partially cross-sectional view of a device 100 with two interconnect modules configured in accordance with further embodiments of the present technology. As illustrated in FIG. 5, the device 100 includes the package substrate 102, the die stack 110 carried by the package substrate 102, and two interconnect modules 520 (referred to individually as the first and second interconnect modules 520a, 520b) carried by the package substrate 102 adjacent the die stack 110. In the illustrated embodiment, the interconnect modules 520 include additional tiers, allowing the interconnect modules 520 to carry bond pads at additional elevations for electrically coupling to the die stack 110.

For example, the first interconnect module 520a includes the lower tier 122, three intermediate tiers 126, and the upper tier 124. The lower tier 122 carries the lower bond pads 123 at a first elevation $E_1$; the intermediate tiers carry first intermediate bond pads 127a at a second elevation $E_2$, second intermediate bond pads 127b at a third elevation $E_3$, and third intermediate bond pads 127c at a fourth elevation $E_4$; and the upper tier 124 carries the upper bond pads 125 at a fifth elevation $E_5$. Each of the intermediate bond pads 127 and the upper bond pads 125 are electrically coupled to the lower bond pads 123. In turn, the lower bond pads can be electrically coupled to the package substrate 102, the second sub-stack 110b can be electrically coupled to the first intermediate bond pads 127a, the fourth sub-stack 110d can be electrically coupled to the second intermediate bond pads 127b, the sixth sub-stack 110f can be electrically coupled to the third intermediate bond pads 127c, and the eighth sub-stack 110h can be electrically coupled to the upper bond pads 125.

Because of the elevation $E_2$ of the first intermediate bond pads 127a, for example, the second wire bonds 144 electrically coupling the second sub-stack 110b to the first intermediate bond pads 127a can be significantly shorter than a wire bond directly to the package substrate 102. Further, because the multiple tiers allow the interconnect modules 520 to provide bond pads at multiple elevations (e.g., tailored to each of the sub-stacks), the second wire bonds 144 electrically coupling, for example, the eighth sub-stack 110h to the upper bond pads 125 can be significantly shorter than a wire bond to a shared tier in the interconnect modules 520 (e.g., as illustrated in FIG. 2). Accordingly, for taller die stacks, it can be advantageous to include the additional tiers to mitigate concerns regarding wire sweep, signal crosstalk, and/or signal delay that may re-emerge in the taller stacks.

Figure 7:
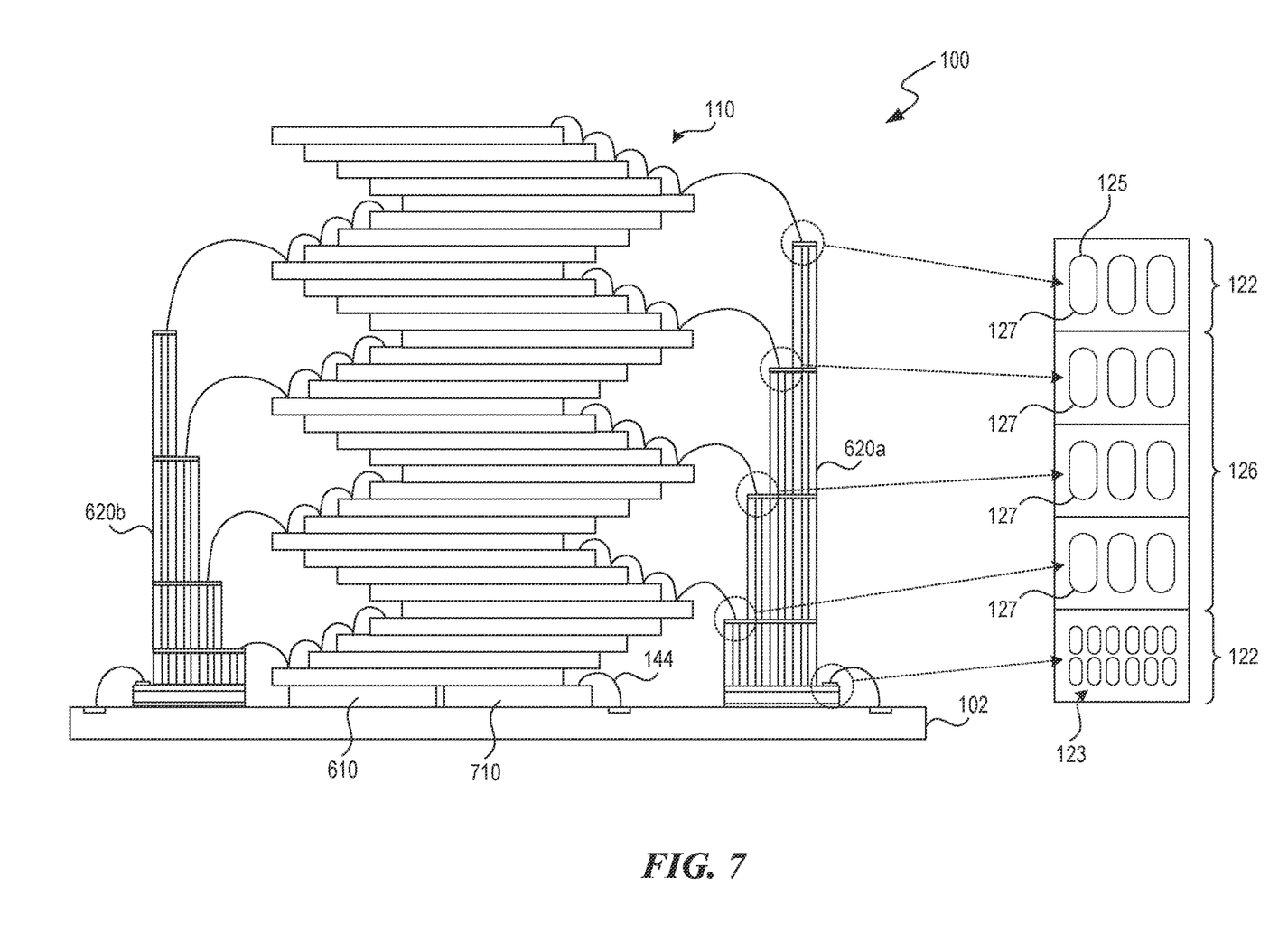
FIG. 7 is a partially cross-sectional view of a semiconductor device that includes varying interconnect modules in accordance with further embodiments of the present technology.

In the illustrated embodiment, the lower tier 122 includes twice the number of bond pads (e.g., the lower bond pads 123) as any of the intermediate and/or upper tiers 126, 124. However, because there are four tiers connected to the lower tier 122, the intermediate bond pads 127 and the upper bond pads 125 still outnumber the lower bond pads 123 by a ratio of 2:1. In various embodiments, the lower tier 122 can include various other numbers of lower bond pads 123, thereby altering the ratio between the bond pads on the intermediate and upper tiers and the lower tier 122 (e.g., as shown in FIG. 7).

As further illustrated in FIG. 5, the second interconnect module 520b also includes additional tiers, allowing the second interconnect module 520b to be electrically coupled to the die stack 110 (e.g., through bond pads and wire bonds) at intermediate elevations. For example, as illustrated, the lower tier 122 can be electrically coupled to the package substrate 102, the third and fifth sub-stacks 110c, 110e can be electrically coupled to the intermediate tiers 126, and the seventh sub-stack 110g can be electrically coupled to the upper tier 124. Similar to the benefits discussed above, the second interconnect module 520b can reduce the length of the second wire bonds 144. For example, the second wire bonds 144 electrically coupling the third sub-stack 110c to the intermediate tiers 126 can be significantly shorter than a wire bond directly to the package substrate 102.

In the embodiment illustrated in FIG. 5, the first and second interconnect modules 520a, 520b elevate bond pads to generally similar elevations. For example, the first intermediate bond pads 127a of each of the first and second interconnect modules 520a, 520b are at the second elevation $E_2$. In other embodiments, the height of individual tiers in the interconnect modules can vary, allowing the interconnect modules to elevate bond pads to varying elevations (e.g., customized to an elevation of a sub-stack to be electrically coupled to the corresponding tier), for example as illustrated in FIGS. 6 and 7 and discussed in more detail below.

As further illustrated in FIG. 5, the first sub-stack 110a is electrically coupled directly to the package substrate 102. Accordingly, the internal redistribution system 130 of the device 100 can include two redistribution layers 131 (referred to individually as a first redistribution layer 131a and a second redistribution layer 131b). The first redistribution layer 131a includes a single array of the first bond pads 132 adjacent the first interconnect module 520a and the second bond pads 134 positioned underneath the first interconnect module 520a. The single array of the first bond pads 132 allow the lower bond pads 123 to be electrically coupled to the package substrate 102 while avoiding dedicating space for unused bond pads. In contrast, the second redistribution layer 131b includes a first array of the first bond pads 132 on a first side of the second interconnect module 520b, a second array of the first bond pads 132 on a second side of the second interconnect module 520b, and the second bond pads 134 positioned underneath the second interconnect module 520b. The first array allows the first sub-stack 110a to be electrically coupled to the package substrate 102, while the second array allows the lower bond pads 123 on the second interconnect module 520b to be electrically coupled to the package substrate 102. Accordingly, the second redistribution layer 131b includes additional redistribution lines as compared to the first redistribution layer 131a.

Figure 6:
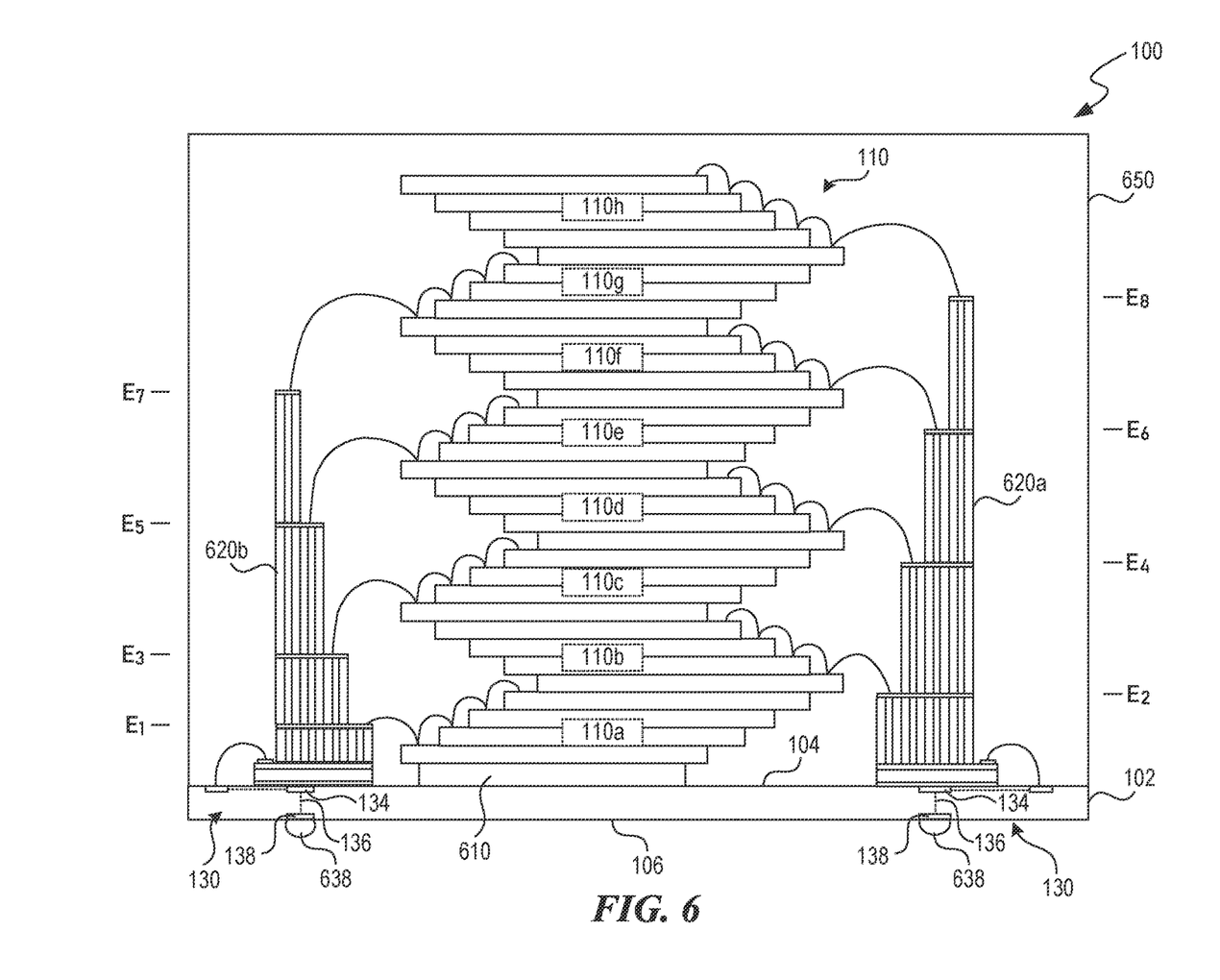
FIG. 6 is a partially cross-sectional view of a semiconductor device that includes varying interconnect modules in accordance with further embodiments of the present technology.

FIG. 6 is a partially cross-sectional view of the semiconductor device 100 with two interconnect modules 620 (referred to individually as first and second interconnect modules 620a, 620b) in accordance with further embodiments of the present technology. In the illustrated embodiment, the device can include an additional die 610 (e.g., a controller die), carried by the package substrate 102. The additional die 610 can be electrically coupled directly to the package substrate 102, for example through flip-chip bonding techniques well known in the art. The die stack 110 can then be stacked on top of the additional die 610, thereby raising the lowermost die of the first sub-stack 110a towards the first elevation $E_1$. As a result, the second wire bonds 144 can be shorter if bonded to the second interconnect module 620b than if bonded to the package substrate 102.

As further illustrated in FIG. 6, each of the interconnect modules 620 includes the lower tier 122 carried by the package substrate 102, three of the intermediate tiers 126 carried by the lower tier 122, and the upper tier carried by the intermediate tiers 126. However, as illustrated in FIG. 6, the heights of each of tiers are not uniform, thereby elevating the intermediate and upper bond pads 127, 125 to varying elevations. For example, the second interconnect module 620b elevates the intermediate bond pads 127 to the first elevation $E_1$, the third elevation $E_3$, and the fifth elevation $E_5$, as well as the upper bond pads 125 to the seventh elevation $E_7$. Similarly, the first interconnect module 620a elevates the intermediate bond pads 127 to the second elevation $E_2$, the fourth elevation $E_4$, and the sixth elevation $E_6$, as well as the upper bond pads 125 to the eighth elevation $E_8$.

In the illustrated embodiment, none of the first-eighth elevations $E_1$-$E_8$ are at the same distance above the package substrate 102. Instead, as illustrated in FIG. 7, each of the first-eighth elevations $E_1$-$E_8$ are a similar distance above the package substrate 102 as a lowermost die in each of the first-eighth sub-stacks 110a-110h, respectively. Accordingly, each of the first-eighth sub-stacks 110a-110h can be electrically coupled to a corresponding bond pad on the interconnect modules 620 through shorter second wire bonds 144, on average, than if the tiers of the interconnect modules 620 had uniform heights.

As further illustrated in FIG. 6, the device 100 can include an encapsulant 650 that at least partially covers the components of the semiconductor device 100. In the illustrated embodiment, the encapsulant 650 completely covers the die stack 110 and the interconnect modules 620. In some embodiments, one or more components (e.g., one or more dies, one or more bond pads on the substrate, and/or one or more of the interconnect modules 620) are at least partially exposed after the encapsulant 650 is formed on the semiconductor device 100. In various embodiments, the encapsulant can be an epoxy resin that is fully cured on the semiconductor device 100. Further, although discussed only with respect to embodiments illustrated in FIG. 6, one of skill in the art will understand that the encapsulant can be included in any of the embodiments disclosed herein, and has been omitted elsewhere purely for the sake of not obscuring features of the embodiments disclosed therein.

As further illustrated in FIG. 6, the device 100 can include the internal redistribution system 130 connecting the first bond pads 132 to the second bond pads 134 at the first surface 104, the substrate connections 136, and then to the third bond pads 138 on the second surface 106. Further, in the illustrated embodiment, one or more package connection structures 638 (e.g., solder balls or another solder structure, another conductive pad, or any other suitable structure) can be electrically and physically coupled to the third bond pads 138. In embodiments in which the package connection structures 638 are solder balls, for example, the device 100 can then be electrically and physically coupled to another carrier (e.g., a carrier circuit board in a memory) by reflowing the solder balls.

FIG. 7 is a partially cross-sectional view of a semiconductor device 100 in accordance with further embodiments of the present technology. Like the device 100 discussed above with respect to FIG. 6, the device 100 illustrated in FIG. 7 includes the additional die 610 carried by the package substrate 102 and two interconnect modules 620 that include various tiers elevating bond pads to varying elevations above the package substrate 102. In the illustrated embodiment, the device 100 also includes a second additional die 710 (e.g., a double data rate (DDR) memory, Low-Power Double Data Rate (LPDDR) memory, and/or any other suitable die). The die stack 110 is carried by both of the additional dies 610, 710 and is electrically coupled to the package substrate through the interconnect modules 620. Meanwhile, the additional dies 610, 710 can be electrically coupled to the package substrate through various connection methods. For example, the first additional die 610 is electrically coupled to the package substrate 102 through a flip-chip connection, while the second additional die 710 is electrically coupled to the package substrate 102 by the second wire bonds 144. In various embodiments, one or both of the additional dies 610, 710 can be electrically coupled to the package substrate 102 through a flip-chip connection, direct wire bonds, the interconnect modules, and/or any other suitable electrical connection.

In some embodiments, the additional dies 610, 710 can be stacked on top of each other and/or include one or more further additional dies beneath the die stack. For example, the device can include two second additional dies 710 stacked beneath and carrying the die stack 110; the first additional die 610 can be stacked on and electrically coupled to the second additional die 710; etc.

As further illustrated in FIG. 7, the lower tier 122 of the interconnect modules 620 can include an equal number of lower bond pads 123 to the total number of the intermediate and upper bond pads 127, 125 included in the interconnect module 620. Combined with the benefits of the interconnect module 620 discussed above, the 1:1 ratio between the lower bond pads 123 and the intermediate and upper bond pads 127, 125 can allow each of the sub-stacks to have an individual signal line without many of the wire sweep, signal cross talk, and signal delay concerns associated with relatively long wire bonds from the upper die stack to the package substrate 102.

Figure 8:
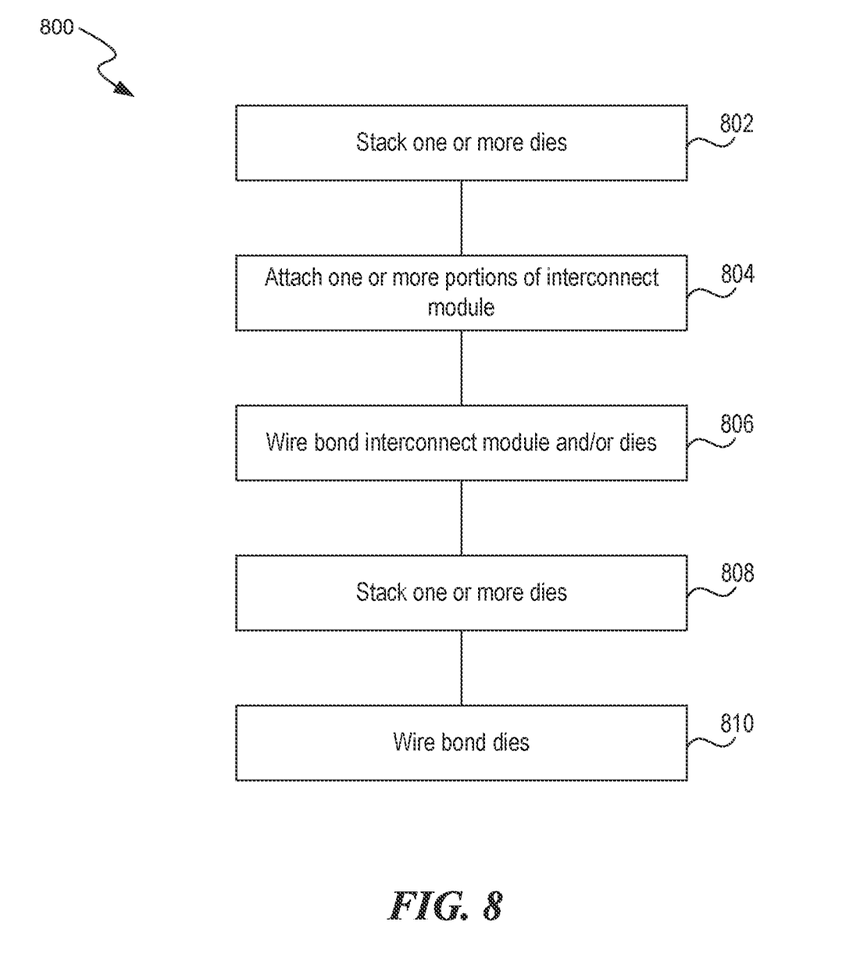
FIG. 8 is a flow diagram of a process for manufacturing a semiconductor device having an interconnect module in accordance with some embodiments of the present technology.

FIG. 8 is a flow diagram of a process 800 for manufacturing a semiconductor device of the type of FIGS. 1A-3 and 5-7 in accordance with some embodiments of the present technology. In the illustrated embodiment, the process begins at block 802 with stacking one or more first dies on a package substrate. The one or more first dies can include a portion of a first sub-stack, the entirety of the first sub-stack, at least a portion of additional sub-stacks, and/or every die that will be included in a relevant die stack.

At block 804, the process 800 includes attaching one or more interconnect modules to the package substrate. Attaching the interconnect modules can include forming a physical connection between the interconnect modules and the package substrate. In various embodiments, attaching the interconnect modules to the package substrate can include using a die attach film between the lower tier and the package substrate and/or a metal connection (e.g., through a reflow process). In some embodiments, attaching the interconnect modules includes physically and/or electrically coupling one or more portions of an interconnect module. For example, the lower tier can be attached to the package substrate, then the upper tier can be attached to the lower tier. In some embodiments, one or more tiers (e.g., portions of the interconnect module), can be withheld in the first pass through block 804, thereby providing additional workspace to form wire bonds and/or attach additional dies. Further, in some embodiments, the process can execute block 804 before executing block 802 to stack dies after the interconnect module is attached to the package substrate.

At block 806, the process 800 includes forming wire bond connections. In some embodiments, the wire bond connections formed at block 806 electrically intercouple each of the one or more first dies and/or intercouple any sub-group of the one or more stacked dies (e.g., intercoupling the first sub-stack, intercoupling the second sub-stack, and the like). Additionally, or alternatively, the wire bond connections can electrically couple any of the one or more first dies to the package substrate and/or the interconnect module. For example, a first sub-stack can be electrically coupled to the package substrate while a second sub-stack can be electrically coupled to the interconnect module and the interconnect module is electrically coupled to the package substrate.

In some embodiments, the process can execute at least part of block 806 before executing block 804 to form wire bonds between at least some of the first dies before attaching the interconnect modules. For example, in some embodiments, the process 800 stacks the first dies on the package substrate at block 802, forms wire bond connections at block 806 between dies in the lower sub-stacks while there is more room to form the wire bonds, then attaches the interconnect modules to the package substrate. In some such embodiments, the process 800 then returns to block 806 to form additional wire bonds (e.g., to electrically couple the upper sub-stacks to the interconnect module).

At optional block 808, the process 800 includes stacking one or more second dies on the first dies. In various embodiments, the one or more second dies can include an additional portion of the first sub-stack, a portion of the second sub-stack, the entirety of the second sub-stack, at least a portion of additional sub-stacks, and/or every additional die that will be included in a relevant die stack (e.g., dies in the second-fourth stacks). In various embodiments, the process 800 can execute optional block 808 before executing block 806 and/or before executing block 804. For example, in some embodiments, the process 800 stacks the first dies on the package substrate at block 802, forms wire bond connections at block 806, then stacks the second dies on the first dies at optional block 808 before attaching the interconnect modules to the package substrate at block 804.

In some embodiments, after executing block 808, the process 800 returns to block 804 to attach one or more additional interconnect modules and/or one or more additional tiers of already attached interconnect modules. For example, the process 800 can attach the lower tier 122 (FIG. 1A) of the interconnect module in the first pass through block 804, then attach the upper tier 124 of the interconnect module in the second pass through block 804.

At optional block 810, the process 800 includes forming additional wire bond connections. In various embodiments, the additional wire bond connections can electrically intercouple the second dies, electrically couple the second dies to the package substrate, electrically couple the second dies to the interconnect module, electrically intercouple one or more of the first and second dies, further electrically intercouple the first dies, and/or electrically couple the first dies to the package substrate. For example, in some embodiments, the additional wire bond connections can electrically intercouple the dies in a second sub-stack of dies as well as electrically couple the second sub-stack to the interconnect module.

In some embodiments, the process does not include optional block 808 and/or optional block 810. For example, in embodiments in which the entirety of the dies are stacked on the package substrate in block 802, the process 800 does not include optional block 808. In another example, in some embodiments in which the process attaches the entirety of the interconnect modules at block 804 before forming any wire bonds, the process 800 does not include optional block 810 because all of the wire bonds can be formed at block 806.

Further, as discussed above, one or more of the blocks 802-810 can be performed in another order than illustrated, repeated, and/or omitted altogether. For example, as discussed above, the process 800 can execute block 804 after block 806 to form wire bonds before the interconnect module is attached to the package substrate; repeat blocks 802-806 as necessary to build up the die stack and the interconnect module gradually; etc. Further, as discussed above, the process 800 can omit some of the blocks discussed above (e.g., any of the optional blocks 808, 810).

Figure 9:
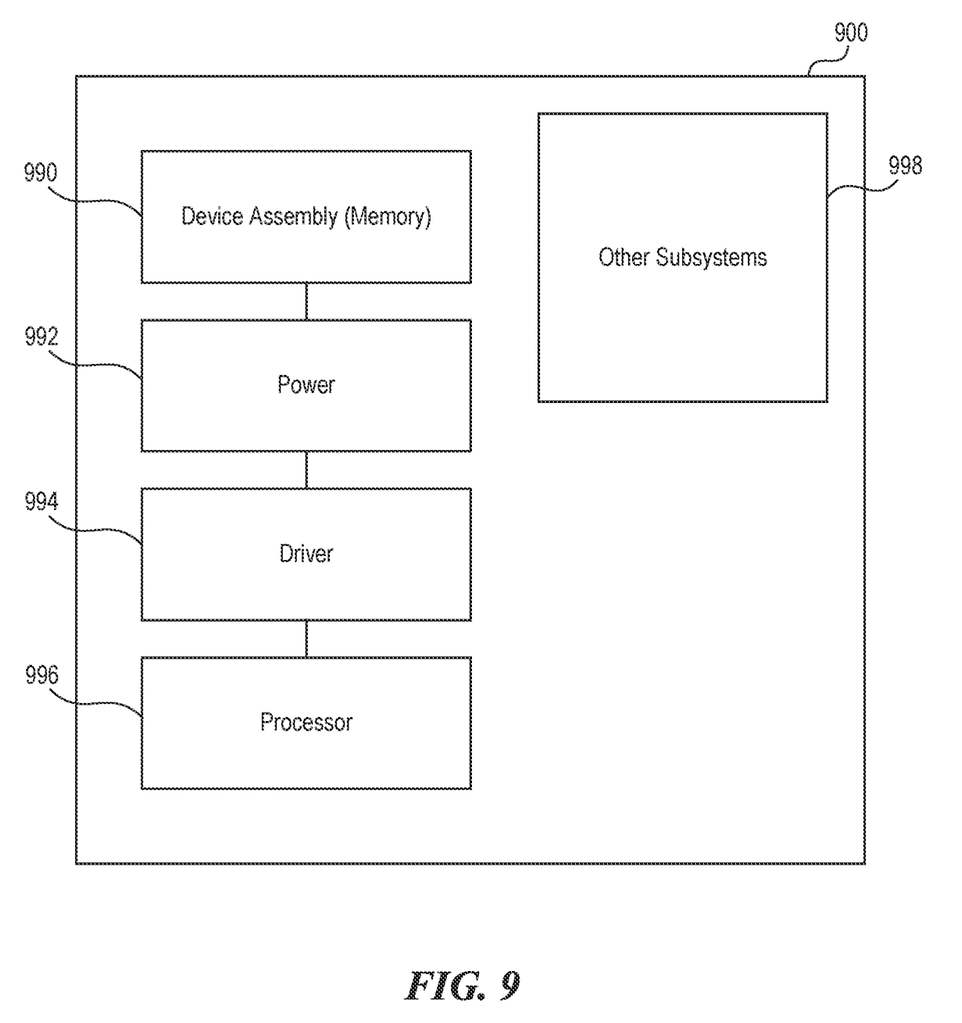
FIG. 9 is schematic view of a system that includes a semiconductor die assembly configured in accordance with embodiments of the present technology.

FIG. 9 is a schematic view of a system 900 that includes a semiconductor die assembly configured in accordance with embodiments of the present technology. Any one of the semiconductor devices having the features and/or resulting from the processes described above with reference to FIGS. 1A-7 can be incorporated into any of a myriad of larger and/or more complex systems, a representative example of which is system 900 shown schematically in FIG. 9. The system 900 can include a memory 990 (e.g., SRAM, DRAM, flash, and/or other memory devices), a power supply 992, a drive 994, a processor 996, and/or other subsystems or components 998. Semiconductor devices like those described above with reference to FIGS. 1-7 (or resulting from the processes described above with respect to FIG. 8), can be included in any of the elements shown in FIG. 9. For example, the memory 990 can include a stacked semiconductor device with a three-dimensional interconnect module such as those described above with respect to FIGS. 4A-4C. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

Conclusion

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a package substrate;
   a stack of semiconductor dies carried by the package substrate, the stack of semiconductor dies including a first die carried by the package substrate and a second die carried by the first die; and
   an interconnect module carried by the package substrate adjacent the stack of semiconductor dies, the interconnect module having at least a first tier and a second tier, wherein:
      the first tier is carried by and electrically coupled to the package substrate, wherein the first tier includes a first plurality of bond pads;
      the second tier has a first end carried by and electrically coupled to the first tier and a second end opposite the first end, wherein the second tier includes a second plurality of bond pads, wherein each bond pad in the first plurality of bond pads is electrically connected to two corresponding bond pads in the second plurality of bond pads, and
      the second die is electrically coupled to at least a subset of the second plurality of bond pads.

2. The semiconductor device of claim 1 wherein the first tier is electrically coupled directly to the package substrate through first wire bonds, and wherein the second die is electrically coupled to the second end of the second tier through second wire bonds.

3. The semiconductor device of claim 1 wherein the first die is electrically coupled directly to the package substrate through wire bonds.

4. The semiconductor device of claim 1 wherein the first die is electrically coupled to the package substrate through the first tier.

5. The semiconductor device of claim 1, wherein:
   the stack of semiconductor dies further includes a third die carried by the second die; and
   the interconnect module further includes a third tier having a lower end carried by and electrically coupled to the second tier and an upper end opposite the lower end, wherein the third die is electrically coupled to the upper end of the third tier.

6. The semiconductor device of claim 5 wherein the subset of the second plurality of bond pads is a first subset of the second plurality of bond pads, the third tier includes a third plurality of bond pads, and wherein each bond pad in the third plurality of bond pads is coupled to a corresponding second bond pad in a second subset of the second plurality of bond pads.

7. The semiconductor device of claim 5 wherein the third tier includes a third plurality of bond pads, and wherein each bond pad in the first plurality of bond pads is electrically connected to a corresponding bond pad in both the second plurality of bond pads and the third plurality of bond pads.

8. The semiconductor device of claim 1, wherein:
   the stack of semiconductor dies further includes a third die carried by the second die;
   the interconnect module is a first interconnect module positioned on a first longitudinal side of the stack of semiconductor dies, and
   the semiconductor device comprises a second interconnect module carried by the package substrate on a second longitudinal side of the stack of semiconductor dies, the second interconnect module having at least a first tier and a second tier, wherein the third die is electrically coupled to the second tier of the second interconnect module.

9. The semiconductor device of claim 1 wherein the package substrate includes a redistribution layer at a surface of the package substrate, and wherein the interconnect module is carried by the surface of the package substrate at least partially over the redistribution layer.

10. A semiconductor device package, comprising:
    a package substrate;
    a stack of semiconductor dies carried by the package substrate, the stack of semiconductor dies comprising:
       a first sub-stack carried by the package substrate at a first elevation, the first sub-stack including a lowermost die attached to the package substrate and an uppermost die above the lowermost die, wherein each die in the first sub-stack is electrically connected to the lowermost die; and
       a second sub-stack carried by the first sub-stack at a second elevation, the second sub-stack including an intermediary die carried by the uppermost die in the first sub-stack, wherein each die in the second sub-stack is electrically connected to the intermediary die; and
    a three-dimensional interconnect module electrically connected to the package substrate, the three-dimensional interconnect module including a first plurality of bond pads at the first elevation and a second plurality of bond pads at the second elevation, wherein the first plurality of bond pads is electrically connected to the package substrate, and wherein the intermediary die in the second sub-stack is electrically connected to the second plurality of bond pads.

11. The semiconductor device package of claim 10 wherein the stack of semiconductor dies further includes a third sub-stack carried by the second sub-stack at a third elevation, wherein the three-dimensional interconnect module further includes a third plurality of bond pads at the third elevation, and wherein the third sub-stack is electrically connected to the third plurality of bond pads.

12. The semiconductor device package of claim 10 wherein the three-dimensional interconnect module further includes a third plurality of bond pads at a third elevation above the second elevation, wherein the stack of semiconductor dies further includes a third sub-stack carried by the second sub-stack, and wherein the third sub-stack is electrically connected to the third plurality of bond pads.

13. The semiconductor device package of claim 10 wherein the first sub-stack is electrically connected to at least a subset of the first plurality of bond pads.

14. The semiconductor device package of claim 10 wherein the package substrate includes a redistribution layer at a surface of the package substrate, and wherein the three-dimensional interconnect module is carried by the surface of the package substrate and positioned at least partially over the redistribution layer.

15. A semiconductor device, comprising:
a package substrate;
a stack of semiconductor dies carried by the package substrate, the stack of semiconductor dies comprising a first sub-stack of two or more dies carried by the package substrate and a second sub-stack of two or more carried by the first sub-stack; and
an interconnect module electrically connected to the package substrate, the interconnect module comprising:
a first tier having a first plurality of bond pads, wherein the first plurality of bond pads is electrically coupled to the package substrate by first wirebonds; and
a second tier electrically coupled to the first tier, the second tier having a second plurality of bond pads, wherein the second sub-stack is electrically coupled to the second plurality of bond pads by second wirebonds.

16. The semiconductor device of claim 15 wherein the second plurality of bond pads includes a predetermined number of bond pads, and wherein the first plurality of bond pads includes double the predetermined number of bond pads.

17. The semiconductor device of claim 15 wherein:
The stack of semiconductor dies further comprises a third sub-stack of two or more dies carried by the second sub-stack; and
the interconnect module further comprises a third tier electrically coupled to the second tier, the third tier having a third plurality of bond pads, wherein the third sub-stack is electrically coupled to the third plurality of bond pads by third wirebonds; and wherein:
the second plurality of bond pads is electrically coupled to a first subset of the first plurality of bond pads, and
the third plurality of bond pads is electrically coupled to a second subset of the first plurality of bond pads independent from the first subset of the first plurality of bond pads.

18. The semiconductor device of claim 15 wherein the first sub-stack is electrically coupled to the package substrate by third wirebonds.

19. The semiconductor device of claim 18 wherein the package substrate includes a redistribution layer comprising:
a third plurality of bond pads positioned between the interconnect module and the stack of semiconductor dies, wherein the first plurality of bond pads is electrically coupled to a first subset of the third plurality of bond pads, and wherein the first sub-stack is electrically coupled to a second subset of the third plurality of bond pads; and
a fourth plurality of bond pads positioned beneath the interconnect module, wherein each of the fourth plurality of bond pads is electrically coupled to one or more of the third plurality of bond pads through the redistribution layer.

20. The semiconductor device of claim 15 wherein the stack of semiconductor dies further comprises a third sub-stack of two or more dies carried by the second sub-stack, and wherein the third sub-stack is electrically coupled to the second plurality of bond pads by third wirebonds.

* * * * *